United States Patent
Guo et al.

(10) Patent No.: US 7,564,689 B1
(45) Date of Patent: Jul. 21, 2009

(54) CLIP FOR HEAT SINK

(75) Inventors: Qing-Lei Guo, Shenzhen (CN); Shou-Li Zhu, Shenzhen (CN); Ming Yang, Shenzhen (CN); Jun Tong, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/115,516

(22) Filed: May 5, 2008

(30) Foreign Application Priority Data

Mar. 14, 2008 (CN) .................. 2008 1 0065852

(51) Int. Cl.
*H05K 7/20* (2006.01)
*F28F 7/00* (2006.01)
*H01L 23/34* (2006.01)

(52) U.S. Cl. .................. 361/704; 24/459; 165/80.3; 165/185; 248/505; 248/510; 257/718; 257/719; 361/719

(58) Field of Classification Search .................. 24/457; 257/718, 719; 361/719, 720
See application file for complete search history.

(56) References Cited

U.S. PATENT DOCUMENTS

| | | | | |
|---|---|---|---|---|
| 5,542,468 A | * | 8/1996 | Lin | 165/80.3 |
| 5,660,562 A | * | 8/1997 | Lin | 439/487 |
| 5,771,960 A | * | 6/1998 | Lin | 165/80.3 |
| 6,400,572 B1 | * | 6/2002 | Wu | 361/704 |
| 6,404,635 B1 | * | 6/2002 | Wei | 361/704 |
| 6,731,504 B1 | * | 5/2004 | Liu | 361/704 |
| 7,061,764 B2 | * | 6/2006 | Lai et al. | 361/704 |
| 7,292,442 B2 | * | 11/2007 | Yu et al. | 361/704 |
| 7,391,615 B2 | * | 6/2008 | Fu et al. | 361/704 |
| 7,430,121 B2 | * | 9/2008 | Lu et al. | 361/719 |
| 7,478,667 B2 | * | 1/2009 | Yang | 165/80.2 |
| 2004/0179340 A1 | * | 9/2004 | Lin | 361/704 |
| 2005/0144764 A1 | * | 7/2005 | Lin | 24/459 |

* cited by examiner

*Primary Examiner*—Gregory D Thompson
(74) *Attorney, Agent, or Firm*—Frank R. Niranjan

(57) ABSTRACT

A clip (100) includes a body (10), a handle (30) and a movable fastener (20). The body has a first end terminating in a supporting portion (16) and a second end terminating in a latching leg (14). The handle has a cam portion (32) supported on the supporting portion and a pivot axis (36) provided on the cam portion. The movable fastener extends through the supporting portion and pivotally couples to the cam portion. The movable fastener defines a slot (22) therein, and the slot starts from an entrance defined in an outer edge at a side of the movable fastener and extends in the movable fastener. The cam portion is pivotally connected to the movable fastener via the pivot axis sliding into the slot from the entrance. The handle is turnable relative to the movable fastener between a locked position and a relaxed position.

17 Claims, 7 Drawing Sheets

US 7,564,689 B1

CLIP FOR HEAT SINK

BACKGROUND

1. Technical Field

The present invention generally relates to a clip for a heat sink, and more particularly to a clip which can readily and securely attach a heat sink to an electronic device.

2. Description of Related Art

A heat sink is usually placed in thermal contact with an electronic package such as a central processing unit (CPU), and transfers heat through conduction away from the electronic package so as to prevent over-heating of the electronic package. Usually, a heat sink is secured to an electronic package by using a clip.

A related clip is shown in US Patent Application Publication No. 2005/0144764A1. The clip comprises a pressing member, an engaging member and a handle. The pressing member comprises an elongated elastic bent section with a bend end at an end thereof. The bent end defines an engaging hole therein for engaging with an engaging jut of a base which surrounds the heat-generating component. A slot is defined in an opposite end of the bent section. The engaging member at an end thereof has a joining part which is provided with a fitting hole for receiving another engaging jut of the base. The engaging member at an opposite end thereof has a piercing part which can pass through the slot. The handle at an end thereof is a pivotal end pivotally connected with the piercing part. A cam is provided on the pivotal end. The handle at an opposite end thereof has a pressing part to pivot the handle relative to the engaging member so that the cam is driven to move on the elastic bent section.

In use of the clip to secure the heat sink to the base, the handle at the pressing part is pressed down to allow the handle pivoting with respect to the pivotal joint of the handle and the engaging member. The cam exerts a force on the elastic bent section such that the elastic bent section can generate tensile deformation against the heat sink to secure the heat sink to the heat-generating component firmly.

However, the clip design has several drawbacks. Since the handle is pivotally connected with the piercing part via a rivet or the like, special tools are usually needed to crimp the rivet so as to hold the piercing part onto the handle. The crimping process of the rivet is troubling and time-consuming, particularly in mass production of the clips. Furthermore, there is high possibility that the clip can not work normally as a result of improper assembly of the rivet, the handle and the piercing part.

Therefore, there is a need for a clip, which can eliminate aforesaid drawbacks.

SUMMARY

The present invention provides a clip. The clip comprises a body, a handle and a movable fastener. The body has a first end terminating in a supporting portion and a second end terminating in a latching leg. The handle has a cam portion supported on the supporting portion and a pivot axis provided on the cam portion. The movable fastener extends through the supporting portion and pivotally couples to the cam portion. The movable fastener defines a slot therein, and the slot starts from an entrance defined in an outer edge at a side of the movable fastener and extends in the movable fastener. The cam portion is pivotally connected to the movable fastener via the pivot axis sliding into the slot from the entrance. The handle is turnable relative to the movable fastener between a locked position and a relaxed position. The movable fastener has a spring plate deviated from the movable fastener. A free end of the spring plate abuts against a bottom of the supporting portion to prevent the movable fastener from separating from the body along a bottom-to-top direction.

Other advantages and novel features of the present heat sink clip will become more apparent from the following detailed description of preferred embodiments when taken in conjunction with the accompanying drawings.

DETAILED DESCRIPTION

Figure 1:
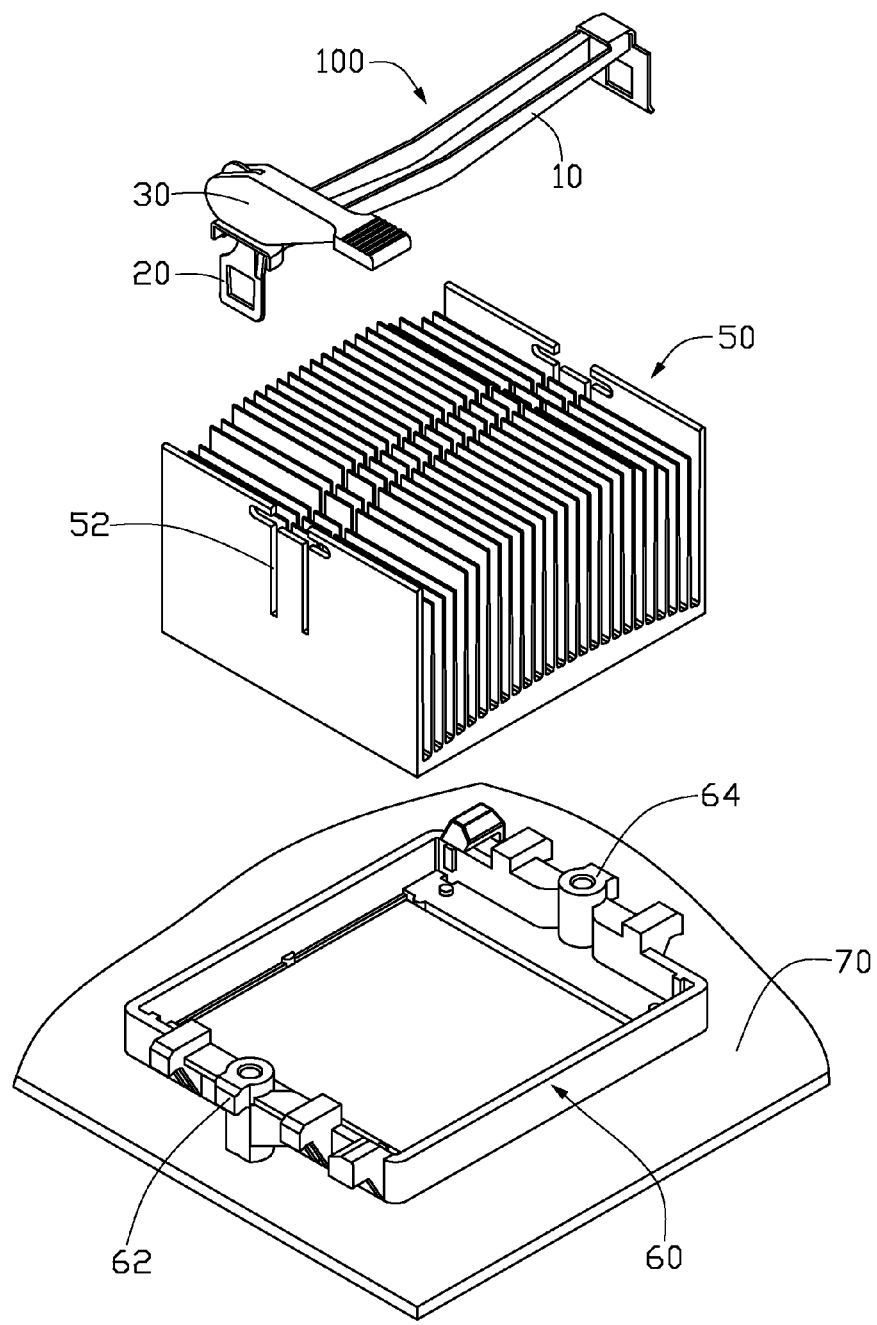
FIG. 1 is an isometric view of a clip in accordance with an embodiment of the present invention together with a heat sink positioned above a printed circuit board.

Reference will now be made to the drawing figures to describe the preferred embodiment in detail.

Referring to FIG. 1, a clip 100 in accordance with an embodiment of the present invention is illustrated. The clip 100 is used to secure a heat sink 50 onto an electronic package (not shown) mounted on a printed circuit board 70. In this embodiment, the heat sink 50 is secured to the printed circuit board 70 through a retention module 60, which provides a pair of protrusions 62, 64 at opposite sides thereof.

Figure 2:
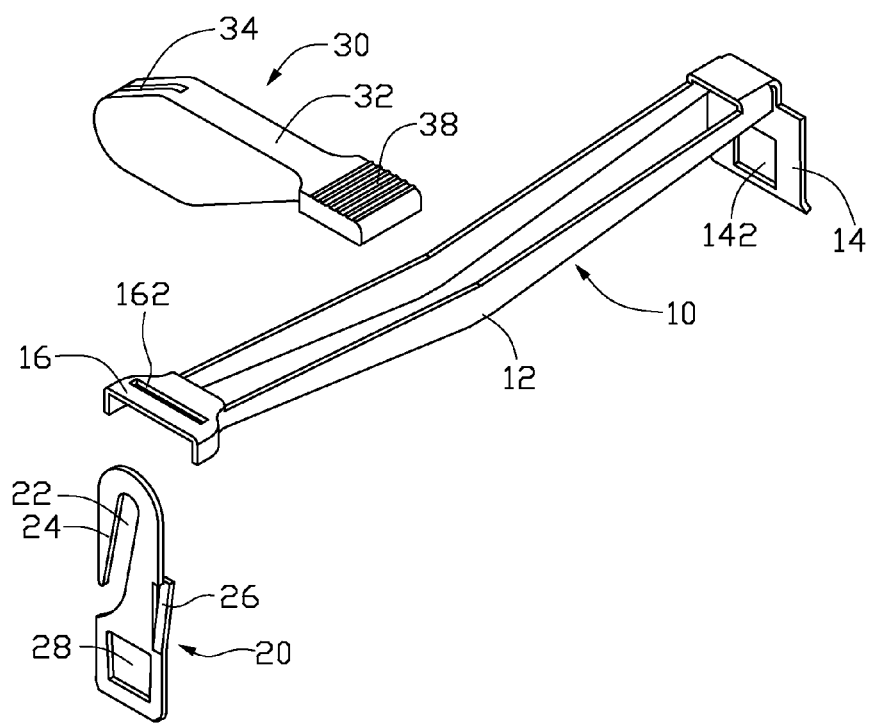
FIG. 2 is an exploded view of the clip in FIG. 1.

Referring to FIG. 2, the clip 100 comprises an elongated body 10, a movable fastener 20 and a handle 30. The handle 30 is pivotally connected to the movable fastener 20 after the movable fastener 20 is inserted through the elongated body 10.

The elongated body 10 comprises an elongated pressing part 12, a latching leg 14 and a flat supporting portion 16. The pressing part 12 is generally V-shaped for providing the pressing part 12 with resilience. The latching leg 14 extends downwardly and outwardly from a free end of the pressing part 12, and defines an opening 142 therein to engage with the protrusion 64. The opening 142 is horizontally oriented. The flat supporting portion 16 extends horizontally from an opposite end of the pressing part 12, and defines one engaging groove 162 therein. The groove 162 is vertically oriented.

The moveable fastener 20 is a plate member and inserted into the engaging groove 162 of the elongated body 10. The movable fastener 20 comprises a retaining hole 28 and an elongated, slantwise slot 22 being defined above the retaining hole 28. The retaining hole 28 is used to engagingly receive the protrusion 62. The slot 22 is used to engagingly receive with a pivot axis 36 (FIG. 3) of the handle 30.

The slot 22 has an entrance (not labeled) defined in an outer edge of a left side of the movable fastener 20 (as shown in FIG. 2), located just above a left, upper corner of the retaining hole 28. The entrance has an arc-shaped lower side. The slot 22 starts from the entrance and extends upwardly and rightward to a position close to a top edge of the movable fastener 20. As a result, a barb 24 is formed an upper portion of the movable fastener 20. The barb 24 is located at a left side of the slot 24.

The moveable fastener 20 further comprises a spring plate 26 formed at the right side thereof (as shown in FIG. 2). The spring plate 26 is punched out of the movable fastener 20 with its free end directed upwardly and slantways. Preferably, the free end of the spring plate 26 is higher than a free end of the barb 24. The free end of the spring plate 26 is laterally shifted from a major portion of the movable fastener 20. The entrance of the slot 22 and the spring plate 26 are at opposite sides of the movable fastener 20.

Figure 3:
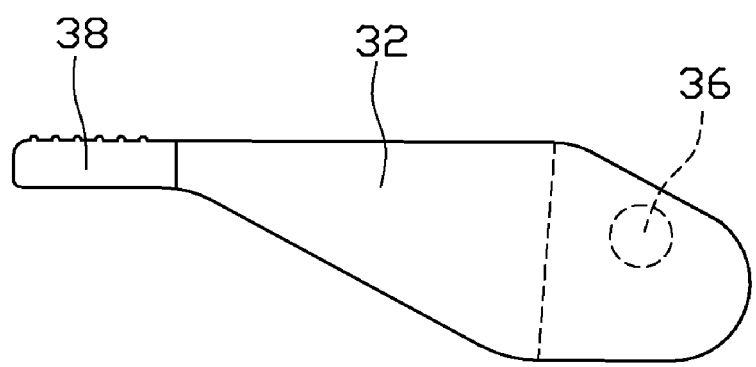
FIG. 3 is a side-elevation view of a handle of the clip in FIG. 2.

Referring to FIG. 3, the handle 30 comprises a cam portion 32 and a handle lever 38 extending from an end of the cam portion 32. A channel 34 is defined in the cam portion 32 and separates the cam portion 32 into two spaced walls (not labeled). The handle 30 further comprises the pivot axis 36 extending between the two spaced walls. The pivot axis 36 has a diameter smaller than a width of the slot 22 so that the pivot axis 36 can slide relative to the movable fastener 30 along the slot 22. The pivot axis 36 and the cam portion 32 are integrally formed as a monolithic piece. Preferably, the handle 30 is formed by plastic injection forming or by die casting.

During the assembly of the clip 100, the handle 30 and the movable fastener 20 are first put together with the pivot axis 36 aimed at the entrance of the slot 22. Afterward, the handle 30 is driven to move to cause the pivot axis 36 to slide into and along the slot 22; thus, the handle 30 and the movable fastener 20 are pre-assembled together.

The pre-assembled handle 30 and the movable fastener 20 are then assembled on the body 10 in such a manner that the movable fastener 20 is inserted into the engaging groove 162 from an upside to a downside thereof until the free end of the spring plate 26 is under the supporting portion 16 with the handle 30 supported on the supporting portion 16. In this process, the spring plate 26 is first squeezed to be deformed due to interaction between the supporting portion 16 defining the engaging groove 162 and the spring plate 26. Subsequently, the spring plate 26 returns to its previous form and serves as a stop preventing the movable fastener 20 from disengaging from the supporting portion 16 of the body 10 along a downside-to-upside direction. Therefore, the clip 100 is assembled together and the handle 30 can rotate round the pivot axis 36 to cause the movable fastener 20 moving upwardly or downwardly relative to the body 10.

To disassemble the clip 100, the spring plate 26 is first squeezed to a position that it is coplanar with the major portion of the movable fastener 20, so that the free end of the spring plate 26 can be moved upwardly into the engaging groove 162. Then the movable fastener 20 can be easily removed from the body 10 along the downside-to-upside direction. Afterward, the handle 30 can be easily removed from the movable fastener 20 via driving the pivot axis 36 to slide out of the slot 22.

Figure 4:
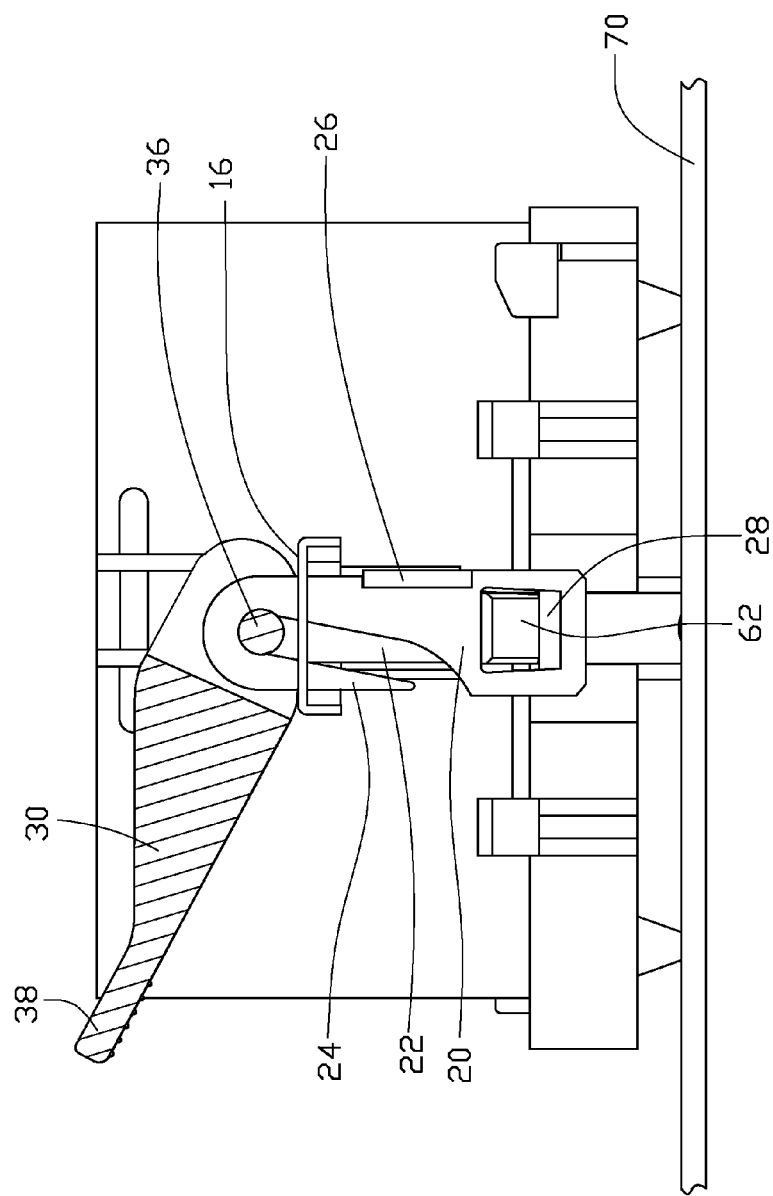
FIG. 4 is a side-elevation, assembled view of the clip and the heat sink of FIG. 1, with the handle shown in a relaxed position.
Figure 5:
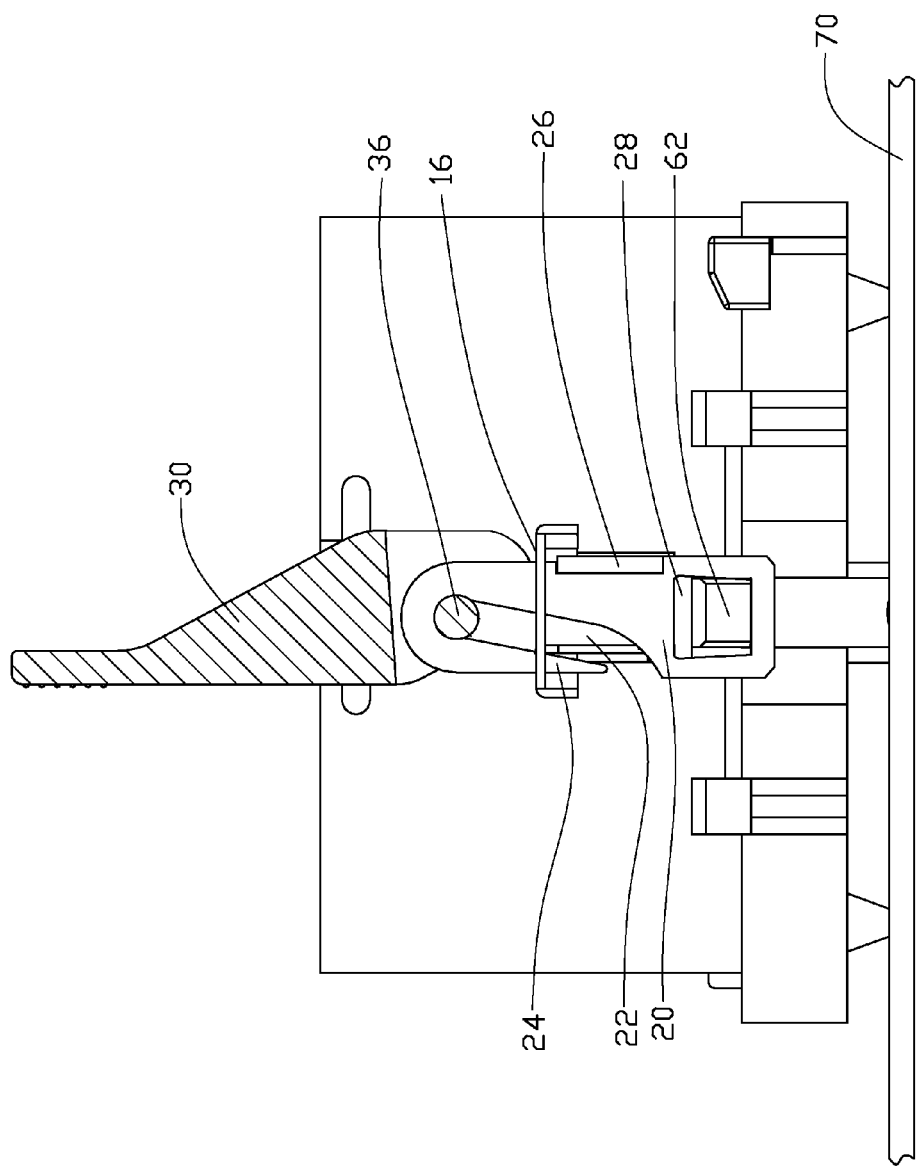
FIG. 5 is similar to FIG. 4, but with the handle shown in a position away from the relaxed position.
Figure 6:
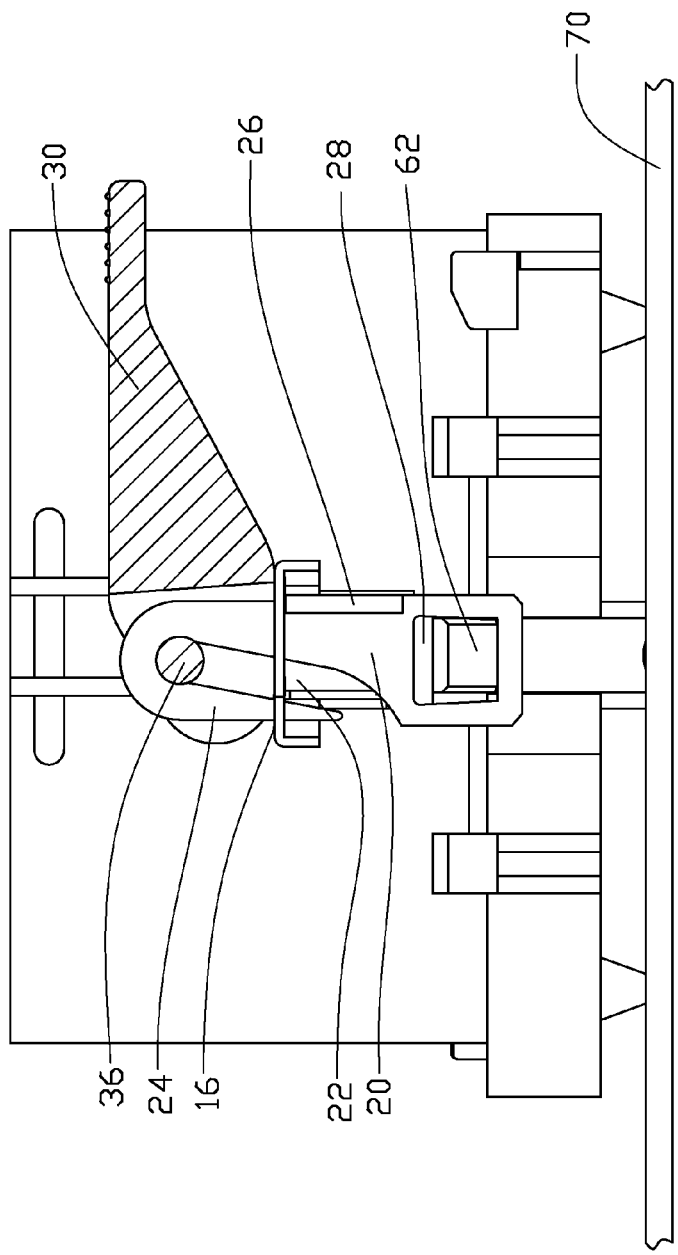
FIG. 6 is similar to FIG. 4, but with the handle shown in a locked position.
Figure 7:
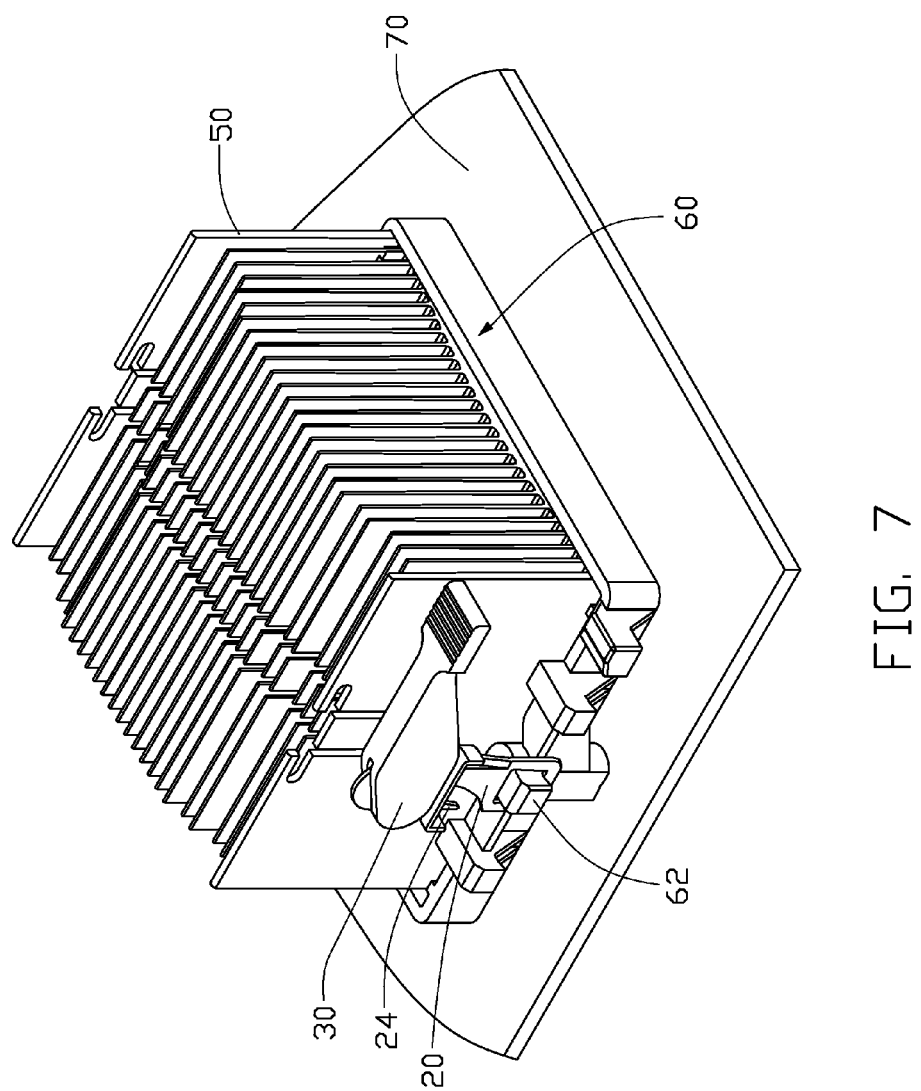
FIG. 7 is an isometric, assembled view of the clip and the heat sink in FIG. 1.

Referring to FIGS. 4-7, the aforesaid clip 100 is used to attach the heat sink 50 on the printed circuit board 70. The clip 100 is first installed in grooves 52 defined in a top portion of the heat sink 50 with the opening 142 hung on the protrusion 64. The retaining hole 28 of the movable fastener 20 is subsequently forced into engagement with the protrusion 62. Then the handle 30 is turned from a relaxed position (as shown in FIG. 4) to a locked position (as shown in FIGS. 6-7) via a median position (as shown in FIG. 5) to force the cam portion 32 into close contact with the supporting portion 16 of the body 10. At the locked position, portions of the latching leg 14 and the movable fastener 20 respectively below the opening 142 and the retaining hole 28 are tightly engaged with the protrusions 62, 64 of the retention module 60, respectively. When set in the locked position, the body 10 is deformed and imparts a downward pressure onto the heat sink 50, thereby keeping a bottom surface of the heat sink 50 in close contact with the electronic package.

To prevent the pivot axis 36 from escaping from the slot 22 due to improper operation or other unexpected reasons, the barb 24 is preferably constructed so that the free end of the barb 24 is kept under the supporting portion 16 unless the spring plate 26 is squeezed to disassemble the movable fastener 20 from the clip 10.

To unlock the clip 100, the handle 30 is turned from the locked position to the relaxed position. Then, the clip 100 can be easily removed from the retention module 60.

As described above, the clip 100 is easily to be assembled or disassembled via the pivot axis 36 sliding into or out of the slot 22 without using a special tool. This makes it convenient and time-saving to assemble or disassemble the clip 100, particularly in mass production. Furthermore, this clip design helps to save the cost of the clip manufacturers since the clip manufacturers can select the movable fasteners, bodies and handles with different sizes to assemble the clips with different sizes, thereby meeting the heat sinks with different sizes or the printed circuit boards with different layouts.

Additionally, as shown in FIG. 6, the spring plate 26 is so constructed that when the handle 30 is driven to rotate from the relaxed position to the locked position, the spring plate 26 is elastically deformed and exerts an elastic force on the body 10 to dampen the force exerted by the clip 100 on the electronic package. Therefore, the spring plate 26 is capable of being squeezed to be deformed in a first direction whereby the movable fastener 20 can slide into or out of the engaging groove 162, and the spring plate 26 is capable of being pressed to be deformed in a second direction perpendicular to the first direction to dampen the force exerted by the clip 100 on the electronic package.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A clip comprising:
   a body having a first end terminating in a supporting portion and a second end terminating in a latching leg;
   a handle having a cam portion supported on the supporting portion and a pivot axis provided on the cam portion;
   a movable fastener extending through the supporting portion and pivotally coupled to the cam portion, wherein the movable fastener defines a slot therein, and the slot starts from an entrance defined in an outer edge at a side of the movable fastener and extends in the movable fastener;
   wherein the cam portion is pivotally coupled to the movable fastener via the pivot axis sliding into the slot from the entrance; and
   wherein the handle is turnable relative to the movable fastener between a locked position and a relaxed position.

2. The clip of claim 1, wherein the entrance of the slot has an arc-shaped side.

3. The clip of claim 1, wherein the slot extends upwardly and slantways to a position close to a top edge of the movable fastener.

4. The clip of claim 3, wherein the moveable fastener further comprises a spring plate formed thereon, the spring plate and the cam portion are at opposite sides of the supporting portion.

5. The clip of claim 4, wherein the spring plate has a free end directing slantways to the cam portion.

6. The clip of claim 5, wherein a barb is formed on an upper portion of the movable fastener, beside the slot.

7. The clip of claim 6, wherein the free end of the spring plate is higher than a free end of the barb.

8. The clip of claim 5, wherein the entrance and the spring plate are at opposite sides of the movable fastener.

9. The clip of claim 3, wherein a channel is defined in the cam portion and separates the cam portion into two spaced walls, and the pivot axes extends between the two spaced walls.

10. The clip of claim 3, wherein an engaging groove is defined through the supporting portion and the movable fastener is movably received in the engaging groove with the slot intercrossing with the engaging groove.

11. A heat dissipation assembly comprising:
a retention module provided with two protrusions;
a heat sink accommodated in the retention module; and
a clip comprising:
a body for pressing the heat sink toward the retention module;
a latching leg connected to one end of the body and attached to one of the protrusions;
a supporting portion connected to another end of the body and having an engaging groove defined therein;
a handle having a cam portion supported on the supporting portion and a pivot axis provided on the cam portion;
a movable fastener movably received in the engaging groove and pivotally coupled to the cam portion, wherein the movable fastener defines a retaining hole attached to the other one of the protrusions and a slot, and the slot starts from an entrance defined in an outer edge at a side of the movable fastener and extends in the movable fastener;
wherein the cam portion is pivotally coupled to the movable fastener via the pivot axis sliding into the slot from the entrance; and
wherein the handle is rotatable relative to the body so that the clip can switch between a locked position and a relaxed position.

12. The heat dissipation assembly of claim 11, wherein the entrance of the slot has an arc-shaped lower side.

13. The heat dissipation assembly of claim 11, wherein the slot extends upwardly and slantways to a position close to a top edge of the movable fastener.

14. The heat dissipation assembly of claim 13, wherein the moveable fastener further comprises a spring plate formed thereon, and the spring plate and the cam portion are at opposite sides of the supporting portion.

15. The heat dissipation assembly of claim 14, wherein the spring plate has a free end directing slantways to the cam portion.

16. The heat dissipation assembly of claim 14, wherein the spring plate is constructed so that the spring plate is capable of being squeezed to be deformed in a first direction to allow the movable fastener to slide into or out of the engaging groove, and the spring plate is capable of being pressed to be deformed in a second direction perpendicular to the first direction to dampen the force exhibited by the clip on the heat sink.

17. A heat sink clip comprising:
a body having at a first end thereof forming a latching leg and a second end thereof forming a supporting portion, the supporting portion defining a groove therethrough;
a handle on the supporting portion, having a cam portion defining a channel and a pivot axis in the channel, the cam portion and the pivot axis being integrally formed as a monolithic piece; and
a movable fastener extending through the groove of the supporting portion, defining a slot having an entrance at a side edge of the movable fastener, the pivot axis of the handle being received in the slot whereby the handle can pivot relative to the movable fastener between a locked position and a relaxed position, the movable fastener forming a spring plate having a free end abutting a bottom of the supporting portion.

* * * * *